United States Patent
Hatwar et al.

(10) Patent No.: US 7,821,201 B2
(45) Date of Patent: Oct. 26, 2010

(54) TANDEM OLED DEVICE WITH INTERMEDIATE CONNECTOR

(75) Inventors: Tukaram K. Hatwar, Penfield, NY (US); Jeffrey P. Spindler, Rochester, NY (US); William J. Begley, Webster, NY (US)

(73) Assignee: Global OLED Technology LLC, Wilmington, DE (US)

(*) Notice: Subject to any disclaimer, the term of this patent is extended or adjusted under 35 U.S.C. 154(b) by 448 days.

(21) Appl. No.: 12/023,216

(22) Filed: Jan. 31, 2008

(65) Prior Publication Data

US 2009/0195146 A1    Aug. 6, 2009

(51) Int. Cl.
*H05B 33/00* (2006.01)
(52) U.S. Cl. ...................... 313/506; 313/504
(58) Field of Classification Search ......... 313/498–512; 428/690
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,683,823 A | 11/1997 | Shi et al. | |
| 6,107,734 A | 8/2000 | Tanaka et al. | |
| 6,337,492 B1 | 1/2002 | Jones et al. | |
| 6,717,358 B1 | 4/2004 | Liao et al. | |
| 2003/0170491 A1 | 9/2003 | Liao et al. | |
| 2003/0189401 A1 | 10/2003 | Kido et al. | |
| 2005/0134173 A1* | 6/2005 | Tsutsui et al. | 313/506 |
| 2005/0189857 A1* | 9/2005 | Kobori | 313/110 |

FOREIGN PATENT DOCUMENTS

| JP | 07-142169 | 6/1995 |
|---|---|---|
| JP | 2003-045676 | 2/2003 |

OTHER PUBLICATIONS

Kido et al., White Light-Emitting Orgnic Electroluminescent Devices Using The Poly (N-Vinylcarbazle) Emitter Layer Doped With Three Fluorescent D, Appl. Phys. Ltr. 64 (7), Feb. 14, 1994, pp. 815-817.
Tokito et al., High-Efficiency White Phosphorescent Organic Light-Emitting Devices With Greenish-Blue and Red-Emitting Layers, Appl. Phys. Ltrs.; vol. 83, No. 12, Sep. 22, 2003, pp. 2459-2461.
Deshpande et al, White-light-emitting organic electroluminescent devices based on interlayer sequential energy transfer, Applied Phys. Letters, 75, 888, 1999.
Matsumoto et al., Late-News Paper: Multiphotoon Organic El Device Having Charge Generation Layer, SID 03 Digest, pp. 979-981; 27.5L.

* cited by examiner

*Primary Examiner*—Nimeshkumar D Patel
*Assistant Examiner*—Anne M Hines
(74) *Attorney, Agent, or Firm*—Morgan Lewis & Bockius LLP

(57) ABSTRACT

A tandem OLED device including an anode; a cathode; at least two electroluminescent units disposed between the anode and the cathode, wherein each of the electroluminescent units includes at least one hole-transporting layer and one organic light-emitting layer; and an intermediate connector of at least two layers disposed between adjacent electroluminescent units, wherein the intermediate connector includes an organic alkali metal complex layer and an organic electron-accepting layer, the organic electron-accepting layer being disposed closer to the cathode than the organic alkali metal complex layer, and there is present metallic aluminum in the organic alkali metal complex layer.

13 Claims, 2 Drawing Sheets

TANDEM OLED DEVICE WITH INTERMEDIATE CONNECTOR

CROSS REFERENCE TO RELATED APPLICATIONS

Reference is made to commonly assigned U.S. patent application Ser. No. 11/393,767, Filed Mar. 30, 2006, now U.S. Published Patent Application No. 2007/0228938, entitled "Efficent White Light OLED Display with Filters" by T. K. Hatwar et al, U.S. patent application Ser. No. 11/259, 472 Filed Oct. 26, 2005, now U.S. Published Patent Application No. 2006/0286405, entitled "Organic Element for Low Voltage Electroluminescent Devices" by William J. Begley et al and U.S. patent application Ser. No. 12/022,427 filed Jan. 30, 2008 entitled "Tandem OLED Device With Intermediate Connector" by T. K. Hatwar et al, the disclosures of which are incorporated herein by reference.

FIELD OF THE INVENTION

The present invention relates to tandem OLED devices and to intermediate connectors between them.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit commonly includes a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885, 211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light can be used in conjunction with filters or color change modules to produce displays with at least two different colors or a full color display. In particular, there is a need for broadband-light-emitting OLEDs (or broadband OLEDS) where there is substantial emission in the red, green, and blue portions of the spectrum, i.e., a white light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported, e.g. by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited, because each type of molecule only emits light with a relatively narrow spectrum under normal conditions. A light-emitting layer having a host material and one or more luminescent dopant(s) can achieve light emission from both the host and the dopant (s), resulting in a broadband emission in the visible spectrum if the energy transfer from the host material to the dopant(s) is incomplete. To achieve a white OLED having a single light-emitting layer, the concentrations of light-emitting dopants must be carefully controlled. This produces manufacturing difficulties. A white OLED having two or more light-emitting layers can have better color and better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks.

A tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and U.S. Patent Publication 2003/0189401 A1, and Liao et al. in U.S. Pat. No. 6,717,358 and U.S. Patent Application Publication 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish-blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units.

Notwithstanding these developments, there remains a need to improve efficiency and driving voltage of tandem OLED devices while maintaining good broadband emission.

SUMMARY OF THE INVENTION

It is therefore an object of the present invention to provide an OLED device with improved efficiency and luminance stability.

This object is achieved by a tandem OLED comprising:
(a) an anode;
(b) a cathode;
(c) at least two electroluminescent units disposed between the anode and the cathode, wherein each of the electroluminescent units includes at least one hole-transporting layer and one organic light-emitting layer; and
(d) an intermediate connector of at least two layers disposed between adjacent electroluminescent units, wherein the intermediate connector includes an organic alkali metal complex layer and an organic electron-accepting layer, the organic electron-accepting layer being disposed closer to the cathode than the organic alkali metal complex layer, and there is present metallic aluminum in the organic alkali metal complex layer.

This object is also achieved by a tandem OLED comprising:
(a) an anode;
(b) a cathode;

(c) at least two electroluminescent units disposed between the anode and the cathode, wherein each of the electroluminescent units includes at least one hole-transporting layer and one organic light-emitting layer; and (d) an intermediate connector of at least two layers disposed between adjacent electroluminescent units, wherein the intermediate connector includes an organic alkali metal complex layer and an organic electron-accepting layer, the organic electron-accepting layer being disposed closer to the cathode than the organic alkali metal complex layer, and there is present metallic aluminum between the organic alkali metal complex layer and the organic electron-accepting layer.

It is an advantage of this invention that it can provide improved efficiency, and in some embodiments it can also provide lower drive voltage.

Since device feature dimensions such as layer thicknesses are frequently in sub-micrometer ranges, the drawings are scaled for ease of visualization rather than dimension accuracy.

DETAILED DESCRIPTION OF THE INVENTION

The term "OLED device" is used in its art-recognized meaning of a display device including organic light-emitting diodes as pixels. It can mean a device having a single pixel. The term "tandem OLED device" is used in its art-recognized meaning of a display device including at least two OLED device units stacked vertically and powered by a single power source. The term "OLED display" as used herein means an OLED device including a plurality of pixels, which can be of different colors. A color OLED device emits light of at least one color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels. In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. The term "white light-emitting" as used herein refers to a device that produces white light internally, even though part of such light can be removed by color filters before viewing.

Figure 1:
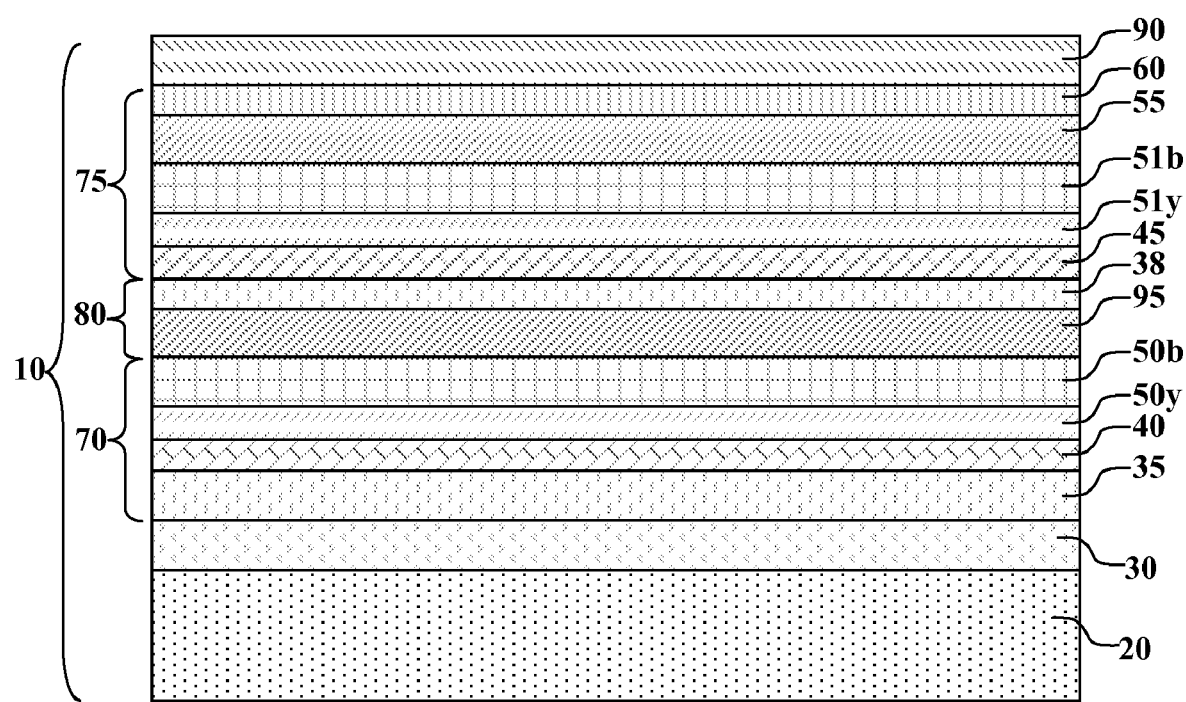
FIG. 1 shows a cross-sectional diagram of one embodiment of a tandem OLED device according to this invention.

Turning now to FIG. 1, there is shown a cross-sectional view of a pixel of a tandem white-light-emitting OLED device 10 according to one embodiment of the present invention. OLED device 10 includes a substrate 20, two spaced electrodes, which are an anode 30 and a cathode 90, at least two electroluminescent units 70 and 75 disposed between the electrodes, and an intermediate connector 80 disposed between adjacent electroluminescent units 70 and 75. Hatwar et al. in above-cited U.S. Ser. No. 11/393,767 has described the use of multiple electroluminescent units of this arrangement. Each electroluminescent unit includes at least one hole-transporting layer, e.g. hole-transporting layers 40 and 45. Electroluminescent unit 70, which is closest to anode 30, can also include a hole-injecting layer 35. Electroluminescent unit 75, which is closest to cathode 90, can also include an electron-transporting layer 55 and an electron-injecting layer 60. Each electroluminescent unit includes at least one organic light-emitting layer. Electroluminescent units 70 and 75 each produce the same emission spectra, but that is not required for this invention. In this embodiment, electroluminescent unit 70 includes blue light-emitting layer 50b that includes a blue light-emitting compound and yellow light-emitting layer 50y that includes a yellow light-emitting compound. As used herein, the term "yellow light-emitting compound" refers to a substance that has its primary light emission in the yellow to red region, that is, from about 570 nm to 700 nm. In this embodiment, electroluminescent unit 75 includes blue and yellow light-emitting layers as in electroluminescent unit 70. The invention described herein is not limited to this combination of light-emitting layers, and many different light-emitting layers and combinations of light-emitting layers can be used as known to those skilled in the art.

Tandem OLED device 10 further includes an intermediate connector 80 of at least two layers disposed between adjacent electroluminescent units 70 and 75. The intermediate connector 80 provides effective carrier injection into the adjacent electroluminescent units. Metals, metal compounds, or other inorganic compounds are effective for carrier injection. However, such materials often have low resistivity, which can result in pixel crosstalk. Also, the optical transparency of the layers constituting intermediate connector 80 should be as high as possible to permit radiation produced in the electroluminescent units to exit the device. Therefore, it is often preferred to use mainly organic materials in the intermediate connector 80. Intermediate connector 80 includes an organic alkali metal complex layer 95 and an organic electron-accepting layer 38. Organic electron-accepting layer 38 is disposed closer to cathode 90 than is organic alkali metal complex layer 95.

In intermediate connector 80, organic alkali metal complex layer 95 includes an organic alkali metal complex. The alkali metal of the organic alkali metal complex belongs to Group 1 of the periodic table. Of these, lithium is highly preferred. Organic alkali metal complexes useful in this invention include organic lithium compounds according to Formula A:

$$(Li^+)_m(Q)_n \qquad \text{A}$$

wherein:

Q is an anionic organic ligand; and m and n are independently selected integers selected to provide a neutral charge on the complex.

The anionic organic ligand Q is most suitably monoanionic and contains at least one ionizable site consisting of oxygen, nitrogen or carbon. In the case of enolates or other tautomeric systems containing oxygen, it will be considered and drawn with the lithium bonded to the oxygen although the lithium can be bonded elsewhere to form a chelate. It is also desirable that the ligand contains at least one nitrogen atom that can form a coordinate or dative bond with the lithium. The integers m and n can be greater than 1 reflecting a known propensity for some organic lithium compounds to form cluster complexes.

In another embodiment, Formula B-1 represents the organic alkali metal complex:

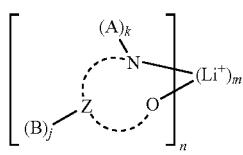

B-1 wherein:

Z and the dashed arc represent two to four atoms and the bonds necessary to complete a 5- to 7-membered ring with the lithium cation;

each A represents hydrogen or a substituent and each B represents hydrogen or an independently selected substituent on the Z atoms, provided that two or more substituents can combine to form a fused ring or a fused ring system;

j is 0-3 and k is 1 or 2; and m and n are independently selected integers selected to provide a neutral charge on the complex.

Of compounds of Formula B-1, it is most desirable that the A and B substituents together form an additional ring system. This additional ring system can further contain additional heteroatoms to form a multidentate ligand with coordinate or dative bonding to the lithium. Desirable heteroatoms are nitrogen or oxygen. Useful compounds of Formula B have been described by Begley in U.S. Patent Application Publication No. 2006/0286405, the disclosure of which is herein incorporated by reference. In Formula B-1, it is preferred that the oxygen shown is part of a hydroxyl, carboxy or keto group. Examples of suitable nitrogen ligands are 8-hydroxyquinoline, 2-hydroxymethylpyridine, pipecolinic acid or 2-pyridinecarboxylic acid.

Specific examples of useful organic alkali metal complexes are as follows:

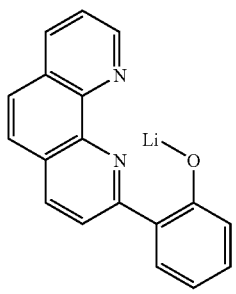

B-2

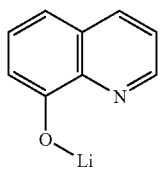

B-3

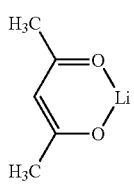

B-4

-continued

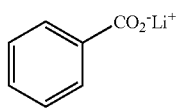

B-5

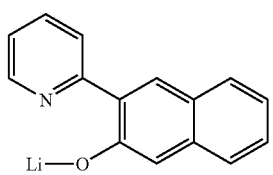

B-6

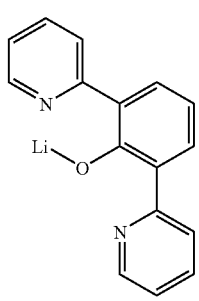

B-7

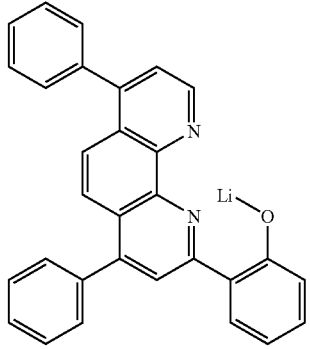

B-8

B-9

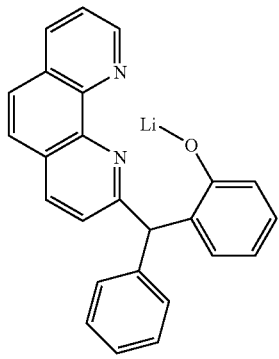

B-10

-continued

B-11
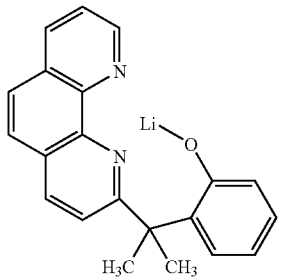

B-12
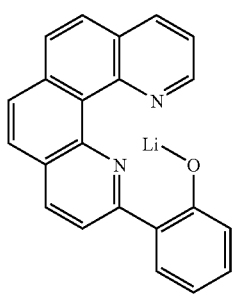

B-13
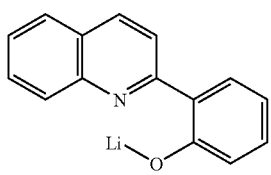

B-14
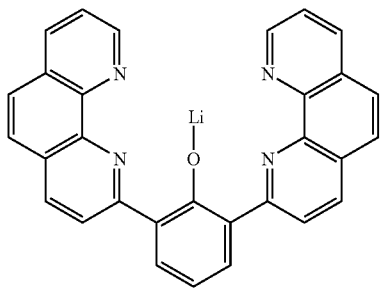

B-15
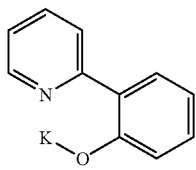

B-16
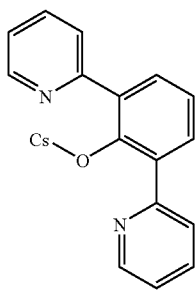

-continued

B-17
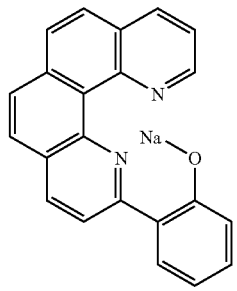

B-18
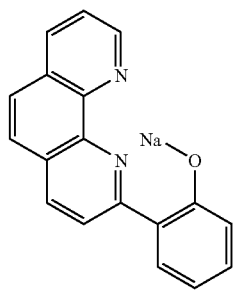

B-19
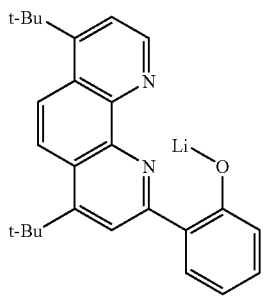

B-20
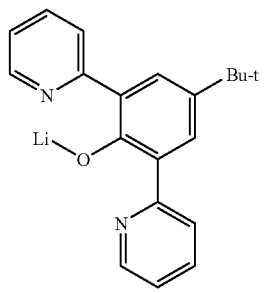

Particularly useful of the above are salts of hydroxyquinoline, e.g. 8-quinolinolato lithium, B-3 and related complexes.

Organic alkali metal complex layer 95 further includes an aromatic hydrocarbon compound. More specifically, the first organic compound of the invention can be selected from compounds represented by the following structures:

C-1 (rubrene)
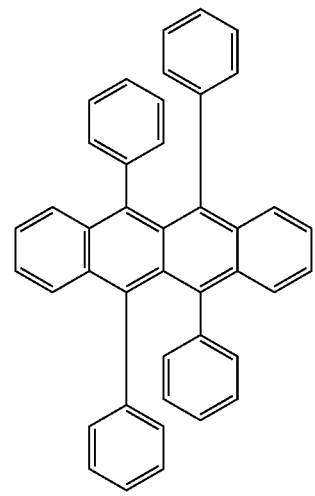
C-2 (perylene)
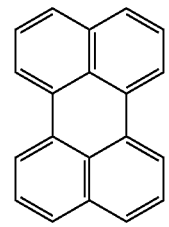
C-3
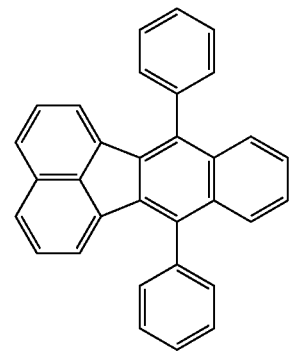
C-4
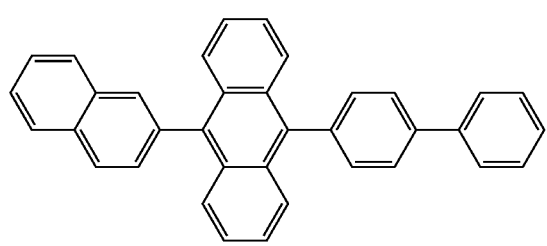
C-5
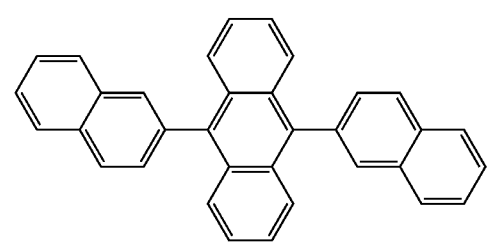
-continued
C-6
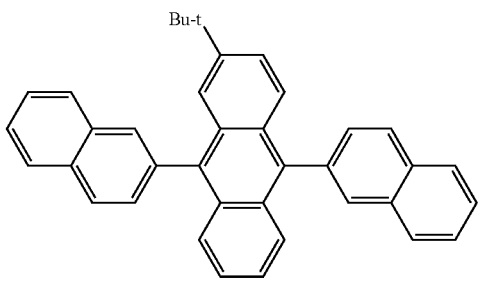
C-7
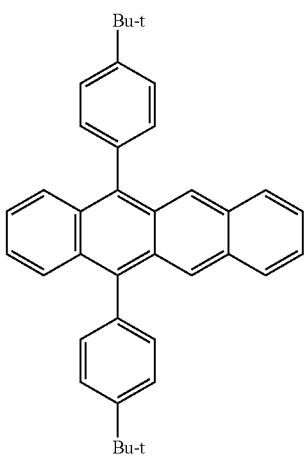
C-8
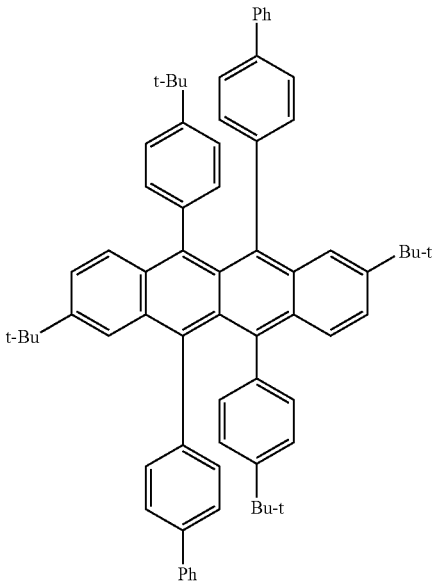

-continued

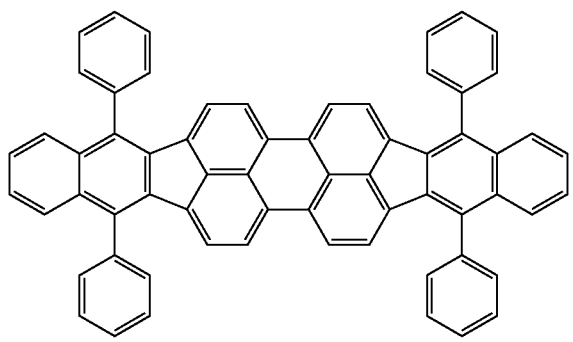

C-9

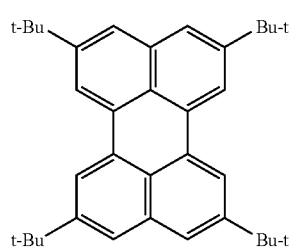

C-10

Also included in the above structures are compounds containing the depicted structural features with substituents suitable to render the structures with the desired properties to function as first organic compound materials of the invention. The hydrocarbon is desirably a rubrene derivative, e.g. compound C-1 and its derivatives.

Organic alkali metal complex layer 95 further includes metallic aluminum. The aluminum is desirably present in an amount in the range of from 0.2 to 5% by volume in the layer, and usefully in the range of from 0.5 to 2%. The aluminum can be co-deposited with the organic alkali metal complex and the aromatic hydrocarbon compound by vacuum evaporative techniques.

Organic electron-accepting layer 38 can include a complex of a metal ion and organic ligands, and a complex of a transition metal ion and organic ligands. Suitable materials for use in organic electron-accepting layer 38 can also include plasma-deposited fluorocarbon polymers (CFx) as described in U.S. Pat. No. 6,208,075, a strong oxidizing agent such as a hexaazatriphenylene derivative (Structure D) as described in U.S. Pat. No. 6,720,573 B2 and in U.S. Published Patent Application No. 2004/113547 A1, or another strong oxidizing agent, which can be organic, such as $F_4TCNQ$ or inorganic, such as molybdenum oxide, $FeCl_3$, or $FeF_3$. Other useful oxidizing agents, also known as electron-accepting materials, are described in U.S. Ser. No. 11/867,707 by Liao et al., the disclosure or which is incorporated herein by reference.

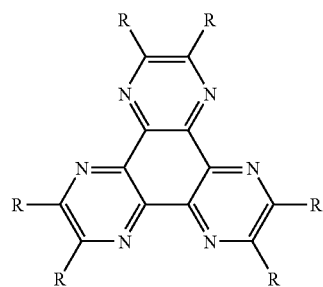

D

A useful hexaazatriphenylene derivative for this purpose is hexacyanohexaazatriphenylene, which has the structure:

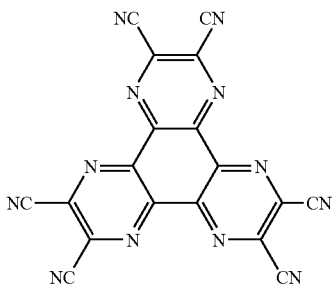

E

While not necessary, organic electron-accepting layer 38 can also be composed of two components: for example, one of the organic materials mentioned above, such as an amine compound, doped with a strong oxidizing agent, such as dipyrazino[2,3-f:2',3'-h]quinoxalinehexacarbonitrile, $F_4TCNQ$, or $FeCl_3$.

OLED devices are commonly formed on a supporting substrate, e.g. OLED substrate 20. The electrode in contact with the substrate 20 is conveniently referred to as the bottom electrode. The substrate 20 can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light-absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

An anode 30 is formed over substrate 20. When EL emission is viewed through the anode, the anode should be transparent, or substantially transparent, to the emission of interest. Common transparent anode materials used in the present invention are indium-tin oxide (ITO), indium-zinc oxide (IZO), and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and many conductive materials can be used, regardless if transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials can be deposited by any suitable process such as evaporation, sputtering, chemical vapor deposition, or electrochemical deposition. If necessary, anode materials can be patterned using well-known photolithographic processes.

A cathode 90 is formed over the other OLED layers. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is bottom-emitting, the cathode can be any conductive material known to be useful in OLED devices, including metals such as aluminum, molybdenum, gold, iridium, silver, magnesium, the above transparent conductive oxides, or combinations of these. Desirable materials promote electron injection at low voltage and have effective stability. Useful cathode materials often contain a low work function metal (<4.0 eV) or metal alloy. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-injecting layer 35 can be formed of a single or a mixture of organic or inorganic materials. The hole-injecting layer can be divided into several layers, with each layer being composed of either the same or different materials. The hole-injecting material can serve to improve the film formation property of subsequent organic layers and to facilitate injection of holes into the hole-transporting layer. Suitable materials for use in the hole-injecting layer are electron-deficient materials that include, but are not limited to porphyrin and phthalocyanine compounds as described in U.S. Pat. No. 4,720,432, phosphazine compounds, and certain aromatic amine compounds which are stronger electron donors than conventional hole-transporting layer materials, such as N,N, N,N-tetraarylbenzidine compounds. In another useful embodiment, the hole-injecting layer includes a compound incorporating a para-phenylenediamine as taught in EP 0 891 121 A1 and EP 1 029 909 A1, dihydrophenazine, 2,6-diaminonaphthalene, 2,6-diaminoanthracene, 2,6,9,10-tetraaminoanthracene, anilinoethylene, N,N,N,N-tetraarylbenzidine, mono- or polyaminated perylene, mono- or polyaminated coronene, polyaminated pyrene, mono- or polyaminated fluoranthene, mono- or polyaminated chrysene, mono- or polyaminated anthanthrene, mono- or polyaminated triphenylene, or mono- or polyaminated tetracene moiety while the second material includes an amine compound that contains either a N,N,N,N-tetraarylbenzidine or a N-arylcarbazole moiety.

The hole-injecting layer can include an inorganic compound(s), such as metal oxide, metal nitride, metal carbide, a complex of a metal ion and organic ligands, and a complex of a transition metal ion and organic ligands.

Suitable materials for use in the hole-injecting layer can also include plasma-deposited fluorocarbon polymers (CFx) as described in U.S. Pat. No. 6,208,075, a strong oxidizing agent such as a hexaazatriphenylene derivative (Structure D, above) as described in U.S. Pat. No. 6,720,573 B2 and in U.S. Published Patent Application No. 2004/113547 A1, or another strong oxidizing agent, which can be organic, such as $F_4TCNQ$ or inorganic, such as molybdenum oxide, $FeCl_3$, or $FeF_3$. A useful hexaazatriphenylene derivative for this purpose is hexacyanohexaazatriphenylene (Structure E, above).

While not necessary, the hole-injecting layer can also be composed of two components: for example, one of the organic materials mentioned above, such as an amine compound, doped with a strong oxidizing agent, such as dipyrazino[2,3-f:2',3'-h]quinoxalinehexacarbonitrile, $F_4TCNQ$, or $FeCl_3$.

Hole-transporting layer 40 can include any hole-transporting material useful in OLED devices, many examples of which are known to those skilled in the art. Desired hole-transporting materials can be deposited by any suitable way such as evaporation, sputtering, chemical vapor deposition, electrochemical process, thermal transfer, or laser thermal transfer from a donor material. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or including at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula F.

wherein:

$Q_1$ and $Q_2$ are independently selected aromatic tertiary amine moieties; and G is a linking group such as an arylene, cycloalkylene, or alkylene group of a carbon to carbon bond.

One class of such aromatic tertiary amines are the tetraaryldiamines. Desirable tetraaryldiamines include two diarylamino groups linked through an arylene group. Useful tetraaryldiamines include those represented by Formula G.

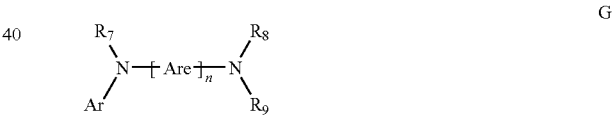

wherein:

each Are is an independently selected arylene group, such as a phenylene or anthracene moiety;

n is an integer of from 1 to 4; and

Ar, $R_7$, $R_8$, and $R_9$ are independently selected aryl groups.

The various alkyl, alkylene, aryl, and arylene moieties of the foregoing structural Formulae F and G can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties. Usefully, the hole-transporting host material is an N,N,N',N'-tetraarylbenzidine, wherein the Are of Formula G represents a phenylene group and n equals 2.

Electron-transporting layer 55 can include any electron-transporting material useful in OLED devices, many examples of which are known to those skilled in the art. Electron-transporting layer 55 can contain one or more metal chelated oxinoid compounds, including chelates of oxine itself, also commonly referred to as 8-quinolinol or 8-hydroxyquinoline. Such compounds help to inject and transport electrons and exhibit both high levels of performance and are readily fabricated in the form of thin films. Exemplary of contemplated oxinoid compounds are those satisfying structural Formula H.

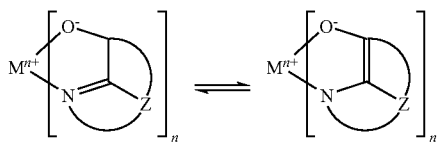

H wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias, tris(8-quinolinolato)aluminum(III)];

CO-2: Magnesium bisoxine[alias, bis(8-quinolinolato)magnesium(II)];

CO-3: Bis[benzo{f}-8-quinolinolato]zinc (II);

CO-4: Bis(2-methyl-8-quinolinolato)aluminum(III)-μ-oxo-bis(2-methyl-8-quinolinolato)aluminum(III);

CO-5: Indium trisoxine[alias, tris(8-quinolinolato)indium];

CO-6: Aluminum tris(5-methyloxine)[alias, tris(5-methyl-8-quinolinolato)aluminum(III)];

CO-7: Lithium oxine[alias, (8-quinolinolato)lithium(I)];

CO-8: Gallium oxine[alias, tris(8-quinolinolato)gallium (III)]; and

CO-9: Zirconium oxine[alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials. Substituted 1,10-phenanthroline compounds known to be useful as electron-transporting materials are disclosed in JP2003/115387; JP2004/311184; JP2001/267080; and WO2002/043449.

The embodiment shown herein includes four organic light-emitting layers: blue light-emitting layers 50b and 51b, and yellow light-emitting layers 50y and 51y. However, this invention is not limited to this configuration. A large variety of light-emitting layers are known in the art and can be used in this invention. Such light-emitting layer can include red light-emitting layers, yellow light-emitting layers, green light-emitting layers, blue light-emitting layers, or combinations of these. Light-emitting layers such as those described herein produce light in response to hole-electron recombination. Desired organic light-emitting materials can be deposited by any suitable way such as evaporation, sputtering, chemical vapor deposition, electrochemical process, or radiation thermal transfer from a donor material. The light-emitting layers in this invention include one or more host materials doped with one or more light-emitting guest compounds or dopants where light emission comes primarily from the dopant. A dopant is selected to produce color light having a particular spectrum and to have other desirable properties. Dopants are typically coated as 0.01 to 15% by weight into the host material.

A light-emitting layer can include an anthracene host, desirably a 9,10-diarylanthracene, certain derivatives of which (Formula I) are known to constitute a class of useful host materials capable of supporting electroluminescence, and are particularly suitable for light emission of wavelengths longer than 400 nm, e.g., blue, green, yellow, orange or red:

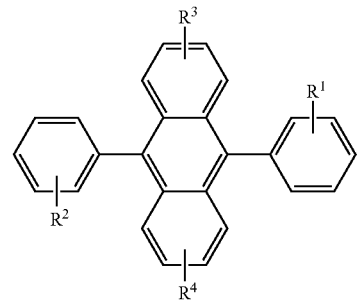

I wherein $R^1$, $R^2$, $R^3$, and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine or cyano.

Particularly useful are compounds wherein $R^1$ and $R^2$, and in some cases $R^3$ and $R^4$, represent additional aromatic rings.

Also useful as host or co-host materials are certain hole-transporting materials such as aromatic tertiary amines (e.g. Structures F and G, above) and certain electron-transporting materials such as chelated oxinoid compounds (e.g. Structure H, above).

In addition to a host material as described above, the light-emitting layers also include one or more dopants as the first light-emitting material. A red-light-emitting dopant can include a diindenoperylene compound of the following structure J:

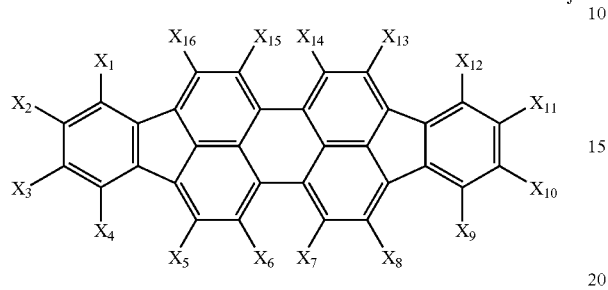

wherein:

$X_1$—$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in U.S. Pat. No. 7,247,394, the disclosure of which is incorporated by reference.

Some other red dopants belong to the DCM class of dyes represented by Formula K:

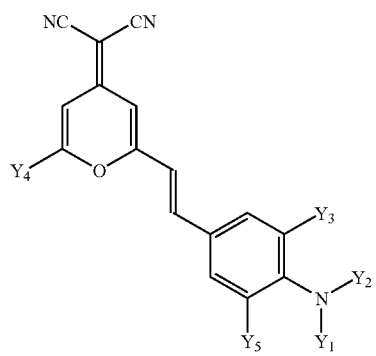

wherein $Y_1$—$Y_5$ represent one or more groups independently selected from: hydro, alkyl, substituted alkyl, aryl, or substituted aryl; $Y_1$—$Y_5$ independently include acyclic groups or can be joined pairwise to form one or more fused rings; provided that $Y_3$ and $Y_5$ do not together form a fused ring. Structures of particularly useful dopants of the DCM class are shown by Ricks et al. in U.S. Pat. No. 7,252,893, the disclosure of which is incorporated by reference.

A light-emitting yellow dopant can include a compound of the following structures:

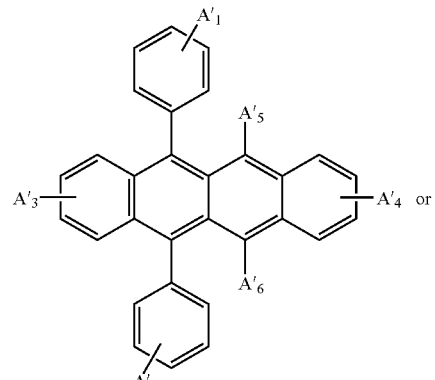

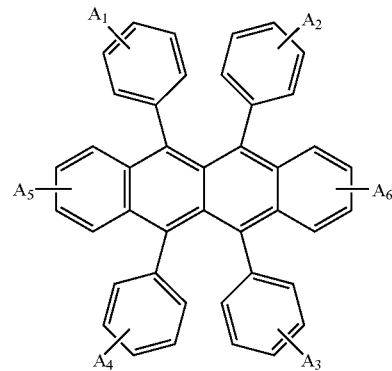

wherein $A_1$-$A_6$ and $A'_1$-$A'_6$ represent one or more substituents on each ring and where each substituent is individually selected from one of the following:

Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro or cyano.

Examples of particularly useful yellow dopants are shown by Ricks et al.

A green light-emitting dopant can include a quinacridone compound, e.g. a compound of the following structure:

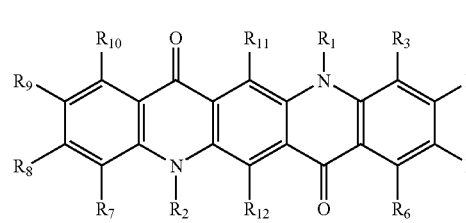

wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, provided that the substituents are selected to provide an emission maximum between 510 nm and 540 nm. Alkyl, alkoxyl, aryl, heteroaryl, fused aromatic ring and fused heteroaromatic ring substituent groups can be further substituted. Some examples of useful quinacridones include those disclosed in U.S. Pat. No. 5,593,788 and in U.S. Patent Application Publication No. 2004/0001969A1.

Examples of useful quinacridone green dopants include:

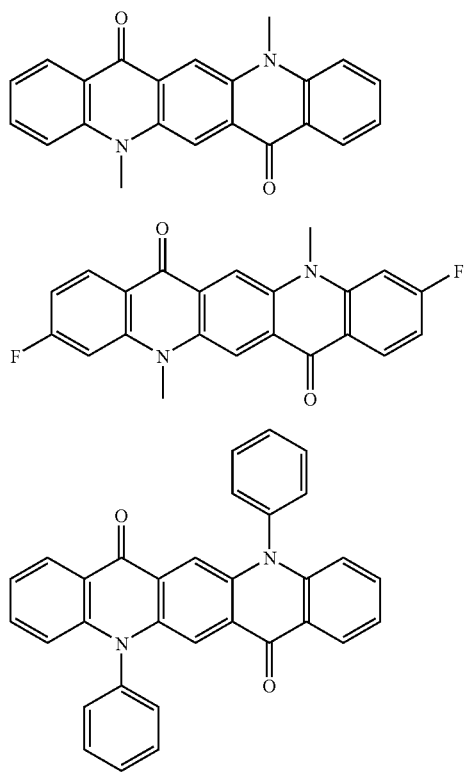

A green light-emitting dopant can also include a 2,6-diaminoanthracene light-emitting dopant, as represented by the formula below:

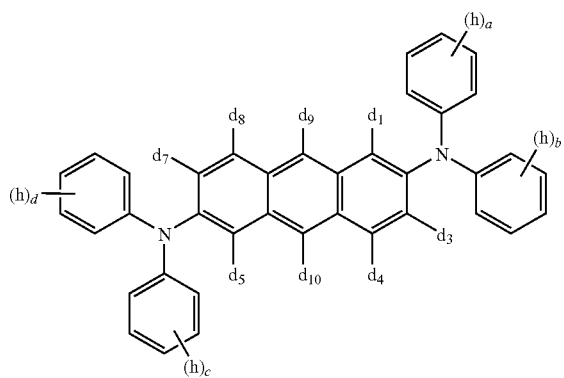

wherein $d_1$, $d_3$-$d_5$, and $d_7$-$d_{10}$ can be the same or different and each represents hydrogen or an independently selected substituent, and each h can be the same or different and each represents one or more independently selected substituents, provided that two substituents can combine to form a ring group and a-d are independently 0-5.

A blue-light-emitting dopant can include a bis(azinyl)azene boron complex compound of the structure P:

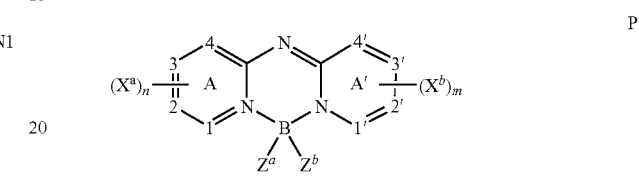

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants are disclosed by Ricks et al. The concentration of this class of dopants in a light-emitting layer is desirably between 0.1% and 5%.

Another class of blue dopants is the perylene class. Particularly useful blue dopants of the perylene class include perylene and tetra-t-butylperylene (TBP).

Another class of blue dopants includes blue-emitting derivatives of such styrylarenes and distyrylarenes as distyrylbenzene, styrylbiphenyl, and distyrylbiphenyl, including compounds described in U.S. Pat. No. 5,121,029, and U.S. Published Patent Application No. 2006/0093856 by Helber et al. Among such derivatives that provide blue luminescence, particularly useful in second light-emitting layer 52 are those substituted with diarylamino groups and herein termed aminostyrylarene dopants. Examples include bis[2-[4-[N,N-diarylamino]phenyl]vinyl]-benzenes of the general structure Q1 shown below:

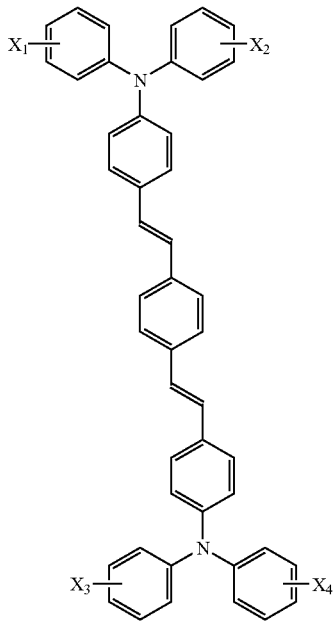

[N,N-diarylamino][2-[4-[N,N-diarylamino]phenyl]vinyl]biphenyls of the general structure Q2 shown below:

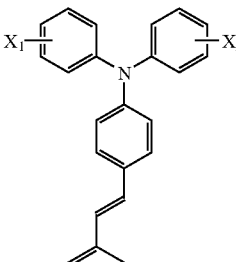

and bis[2-[4-[N,N-diarylamino]phenyl]vinyl]biphenyls of the general structure Q3 shown below:

In Formulas Q1 to Q3, $X_1$—$X_4$ can be the same or different, and individually represent one or more substituents such as alkyl, aryl, fused aryl, halo, or cyano. In a preferred embodiment, $X_1$—$X_4$ are individually alkyl groups, each containing from one to about ten carbon atoms. A particularly preferred blue dopant of this class is disclosed by Ricks et al in U.S. Pat. No. 7,252,893.

OLED device 10 can include other layers as well. For example, an electron-injecting layer 60, such as alkaline or alkaline earth metals, alkali halide salts, or alkaline or alkaline earth metal doped organic layers, can also be present between cathode 90 and electron-transporting layer 55.

Figure 2:
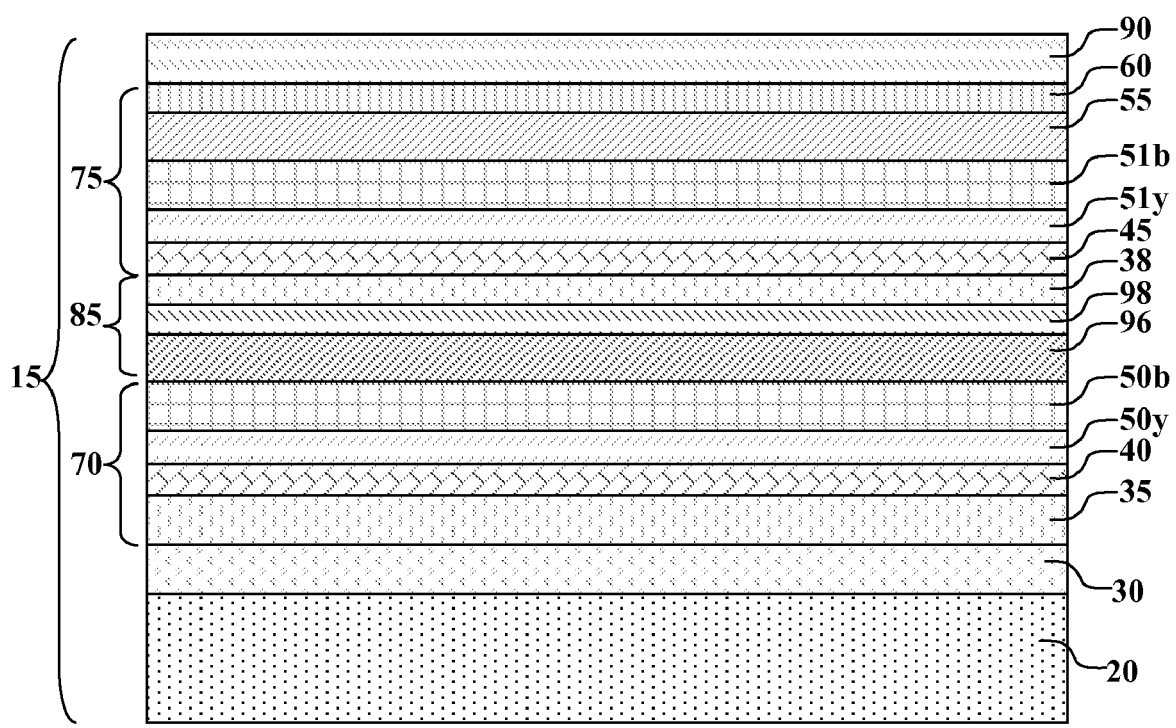
FIG. 2 shows a cross-sectional diagram of another embodiment of a tandem OLED device according to this invention.

Turning now to FIG. 2, there is shown a cross-sectional view of another embodiment of a tandem OLED device 15 in accordance with this invention. In this embodiment, metallic aluminum is present in intermediate connector 85 as metallic aluminum layer 98 between an organic alkali metal complex layer 96 and organic electron-accepting layer 38. In intermediate connector 85, organic electron-accepting layer 38 is as described above for intermediate connector 80. Organic alkali metal complex layer 96 includes at least an organic alkali metal complex and an aromatic hydrocarbon compound, as described above for organic alkali metal complex layer 95. Organic alkali metal complex layer 96 can optionally include metallic aluminum in the levels as described above for organic alkali metal complex layer 95, but this is not required. Metallic aluminum layer 98 forms a layer of from 0.1 to 2 nm in thickness, and usefully from 0.2 to 1 nm in thickness.

The invention and its advantages can be better appreciated by the following comparative examples. Examples 2 to 10 are representative examples of this invention, while Example 1 is a non-inventive tandem OLED example for comparison purposes. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm².

The devices were tested by applying a current of 20 mA/cm² across electrodes. The results from Examples 1 to 10 are given in Table 1.

TABLE 1

Device data measured at 20 mA/cm²

| Device # | Voltage | Lum Efficiency (cd/A) | Power Efficiency (W/A) | CIEx | CIEy |
|---|---|---|---|---|---|
| Example 1 (Comparative) | 15 | 10.8 | 0.095 | 0.41 | 0.4 |
| Example 2 (Inventive) | 11.7 | 17.4 | 0.157 | 0.36 | 0.37 |
| Example 3 (Inventive) | 13 | 17.2 | 0.157 | 0.36 | 0.35 |
| Example 4 (Inventive) | 19.8 | 14.3 | 0.131 | 0.37 | 0.37 |
| Example 5 (Inventive) | 15.5 | 11.5 | 0.1 | 0.4 | 0.38 |
| Example 6 (Inventive) | 12.8 | 14.1 | 0.129 | 0.36 | 0.36 |
| Example 7 (Inventive) | 12.5 | 16.8 | 0.153 | 0.36 | 0.37 |
| Example 8 (Inventive) | 11.6 | 17.2 | 0.153 | 0.36 | 0.37 |
| Example 9 (Inventive) | 11.3 | 16.2 | 0.139 | 0.36 | 0.38 |
| Example 10 (Inventive) | 11.3 | 16.3 | 0.128 | 0.38 | 0.43 |
| Example 11 (Comparative) | 10 | 1.5 |  | 0.41 | 0.41 |

Example 1

Comparative

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 10 nm layer of hexacyanohexaazatriphenylene (CHATP, which is Compound E, above) as a hole-injecting layer (HIL).

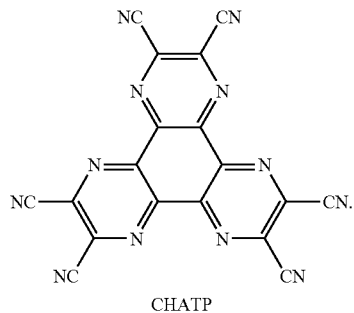

CHATP

4. The above-prepared substrate was further treated by vacuum-depositing a 30 nm layer of 4,4'-bis[N-(1-naphthyl)-N-phenylamino]biphenyl (NPB) as a hole-transporting layer (HTL).
5. The above-prepared substrate was further treated by vacuum-depositing a 20 nm yellow light-emitting layer including 77% NPB (as host) and 20% 9-(2-naphthyl)-10-(4-biphenyl)anthracene (BNA) as a co-host with 3% yellow-orange emitting dopant diphenyltetra-t-butylrubrene (PTBR).

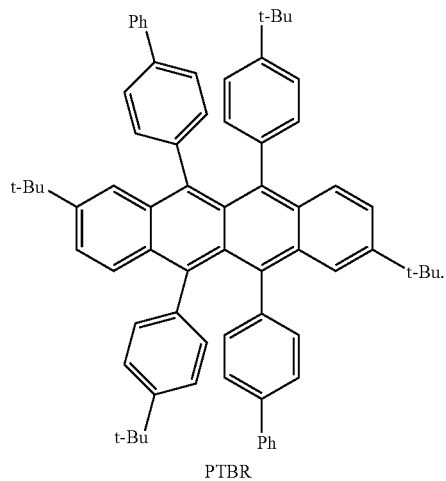

PTBR

6. The above-prepared substrate was further treated by vacuum-depositing a 20 nm blue light-emitting layer including 93% 2-phenyl-9,10-bis(2-naphthyl)anthracene (PBNA) host and 6% NPB co-host with 1% BEP as blue-emitting dopant.

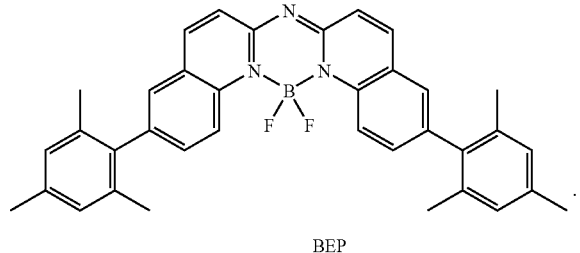

BEP

7. A 35 nm organic alkali metal complex layer was vacuum-deposited, including 60% PTBR and 40% 8-quinolinolato lithium (LiQ) as co-host.
8. The above-prepared substrate was further treated by vacuum-depositing a 10 nm layer of CHATP as an organic electron-accepting layer.
9. The above-prepared substrate was further treated by vacuum-depositing a 40 nm layer of NPB as a hole-transporting layer (HTL).
10. The above-prepared substrate was further treated by vacuum-depositing a 20 nm yellow light-emitting layer including 77% NPB (as host) and 20% BNA as a co-host with 3% yellow-orange emitting dopant PTBR.
11. The above-prepared substrate was further treated by vacuum-depositing a 20 nm blue light-emitting layer including 93% PBNA host and 6% NPB co-host with 1% BEP as blue-emitting dopant.
12. A 35 nm electron-transporting layer was vacuum-deposited, including 60% PTBR and 40% 8-quinolinolato lithium (LiQ) as co-host.
13. A 0.5 nm electron-injecting layer of lithium fluoride was vacuum-deposited.
14. A 100 nm layer of aluminum was evaporatively deposited onto the substrate to form a cathode layer.

Example 2

Inventive

An OLED device was constructed as described above for Example 1 except that Step 7 was as follows:
7. A 35 nm organic alkali metal complex layer was vacuum-deposited, including 59.7% PTBR and 39.8% LiQ as co-host, with 0.5% Al metal doping.

Example 3

Inventive

An OLED device was constructed as described above for Example 1 except that Step 7 was as follows:
7. A 35 nm organic alkali metal complex layer was vacuum-deposited, including 58.8% PTBR and 39.2% LiQ as co-host, with 2.0% Al metal doping.

Example 4

Inventive

An OLED device was constructed as described above for Example 1 except that Step 7 was as follows:
7. A 35 nm organic alkali metal complex layer was vacuum-deposited, including 57% PTBR and 38% LiQ as co-host, with 5.0% Al metal doping.

Example 5

Inventive

An OLED device was constructed as described above for Example 1 except that Step 7a followed Step 7:
7a. A 0.1 nm aluminum metal layer was vacuum-deposited over the organic alkali metal complex layer.

Example 6

Inventive

An OLED device was constructed as described above for Example 5 except that in Step 7a the aluminum metal layer was 0.2 nm thick.

Example 7

Inventive

An OLED device was constructed as described above for Example 5 except that in Step 7a the aluminum metal layer was 0.3 nm thick.

Example 8

Inventive

An OLED device was constructed as described above for Example 5 except that in Step 7a the aluminum metal layer was 0.4 nm thick.

Example 9

Inventive

An OLED device was constructed as described above for Example 5 except that in Step 7a the aluminum metal layer was 0.5 nm thick.

Example 10

Inventive

An OLED device was constructed as described above for Example 5 except that in Step 7a the aluminum metal layer was 1.0 nm thick.

Example 11

Comparative

An OLED device was constructed as described above for Example 5 except that in Step 7a the aluminum metal layer was 2.0 nm thick.

The results of testing these examples are shown in Table 1, below. The inventive examples show, relative to their respective comparative example, improved luminance efficiency and power efficiency, and most also show improved drive voltage. Example 5, which includes a 0.1 nm aluminum metal layer, only shows a slight improvement, making it the minimum thickness aluminum layer necessary. Example 11 shows very poor luminance efficiency, showing that an aluminum layer of 2 nm is too thick.

This invention uses an organic electron-accepting layer. Kido et al., in US 2003/0189401, have shown the use of an electron-accepting layer. However, they present primarily inorganic electron-accepting materials in such layers. In only one example is an organic electron-accepting material present, that is tetrafluorotetracyanoquindimethane ($F_4TCNQ$), and in that example the operating voltage is too high to provide a usable device.

The invention has been described in detail with particular reference to certain preferred embodiments thereof, but it will be understood that variations and modifications can be effected within the spirit and scope of the invention.

PARTS LIST

10 OLED device
15 OLED device
20 substrate
30 anode
35 hole-injecting layer
38 organic electron-accepting layer
40 hole-transporting layer
45 hole-transporting layer
50y yellow light-emitting layer
50b blue light-emitting layer
51y yellow light-emitting layer
51b blue light-emitting layer
55 electron-transporting layer
60 electron-injecting layer
70 electroluminescent unit
75 electroluminescent unit
80 intermediate connector
85 intermediate connector
90 cathode
95 organic alkali metal complex layer
96 organic alkali metal complex layer
98 metallic aluminum layer

The invention claimed is:
1. A tandem OLED device comprising:
   (a) an anode;
   (b) a cathode;
   (c) at least two electroluminescent units disposed between the anode and the cathode, wherein each of the electrolu- minescent units includes at least one hole-transporting layer and one organic light-emitting layer; and (d) an intermediate connector of at least two layers disposed between adjacent electroluminescent units, wherein the intermediate connector includes an organic alkali metal complex layer and an organic electron-accepting layer, the organic electron-accepting layer being disposed closer to the cathode than the organic alkali metal complex layer, and there is present metallic aluminum in the range of from 0.2 to 5% in the organic alkali metal complex layer.

2. The tandem OLED device of claim 1 wherein the metallic aluminum is present in the range of from 0.5 to 2%.

3. The tandem OLED device of claim 1 wherein the organic alkali metal complex layer includes an organic alkali metal complex and an aromatic hydrocarbon compound.

4. The tandem OLED device of claim 3 wherein the organic alkali metal complex is a salt of hydroxyquinoline.

5. The tandem OLED device of claim 3 wherein the hydrocarbon compound is a rubrene derivative.

6. The tandem OLED of claim 1 wherein the organic electron-accepting layer includes a hexaazatriphenylene derivative.

7. A tandem OLED device comprising:
(a) an anode;
(b) a cathode;
(c) at least two electroluminescent units disposed between the anode and the cathode, wherein each of the electroluminescent units includes at least one hole-transporting layer and one organic light-emitting layer; and (d) an intermediate connector of at least two layers disposed between adjacent electroluminescent units, wherein the intermediate connector includes an organic alkali metal complex layer and an organic electron-accepting layer, the organic electron-accepting layer being disposed closer to the cathode than the organic alkali metal complex layer, and there is present metallic aluminum in a layer of from 0.1 to 2 nm thickness between the organic alkali metal complex layer and the organic electron-accepting layer.

8. The tandem OLED device of claim 7 wherein the metallic aluminum forms a layer of from 0.2 to 2 nm thickness.

9. The tandem OLED device of claim 7 wherein the organic alkali metal complex layer includes an organic alkali metal complex and an aromatic hydrocarbon compound.

10. The tandem OLED device of claim 9 wherein the organic alkali metal complex is a salt of hydroxyquinoline.

11. The tandem OLED device of claim 9 wherein the hydrocarbon compound is a rubrene derivative.

12. The tandem OLED of claim 7 wherein the organic electron-accepting layer includes a hexaazatriphenylene derivative.

13. The tandem OLED of claim 7 wherein there is further present metallic aluminum in the range of from 0.2 to 5% in the organic alkali metal complex layer.

* * * * *